(12) United States Patent
Yang et al.

(10) Patent No.: US 11,906,600 B2
(45) Date of Patent: Feb. 20, 2024

(54) ELECTRICAL TEST DEVICE

(71) Applicant: Tyco Electronics (Shanghai) Co., Ltd., Shanghai (CN)

(72) Inventors: An (Joshua) Yang, Shanghai (CN); Lvhai (Samuel) Hu, Shanghai (CN)

(73) Assignee: Tyco Electronics (Shanghai) Co., Ltd., Shanghai (CN)

( * ) Notice: Subject to any disclaimer, the term of this patent is extended or adjusted under 35 U.S.C. 154(b) by 0 days.

(21) Appl. No.: 17/732,940

(22) Filed: Apr. 29, 2022

(65) Prior Publication Data

US 2022/0349954 A1 Nov. 3, 2022

(30) Foreign Application Priority Data

Apr. 29, 2021 (CN) .......................... 202120919936.X

(51) Int. Cl.
*G01R 31/58* (2020.01)
*G01R 31/69* (2020.01)

(52) U.S. Cl.
CPC ............. *G01R 31/58* (2020.01); *G01R 31/69* (2020.01)

(58) Field of Classification Search
None
See application file for complete search history.

(56) References Cited

U.S. PATENT DOCUMENTS

2012/0126823 A1\* 5/2012 Lussier .................. G01R 31/58
324/555

\* cited by examiner

*Primary Examiner* — Jermele M Hollington
*Assistant Examiner* — Haidong Zhang
(74) *Attorney, Agent, or Firm* — Barley Snyder

(57) ABSTRACT

An electrical test device for testing electrical characteristics of a cable assembly with a plurality of cable connectors includes a frame having a test platform, and an electrical tester mounted on the frame for testing the electrical characteristics of the cable assembly. A cable connecting and holding mechanism is provided on the test platform and includes a plurality of connector carriers, wherein each connector carrier holds one of the plurality of cable connectors of the cable assembly and electrically connecting the one cable connector to the electrical tester.

22 Claims, 5 Drawing Sheets

ELECTRICAL TEST DEVICE

CROSS-REFERENCE TO RELATED APPLICATIONS

This application claims the benefit of Chinese Patent Application No. CN202120919936.X filed on Apr. 29, 2021 in the State Intellectual Property Office of China, the whole disclosure of which is incorporated herein by reference.

FIELD OF THE INVENTION

The embodiments of the present disclosure generally relate to the test of the electrical characteristics of products, and more specifically, to an electrical test device for testing a cable assembly with connectors.

BACKGROUND

Generally, after the assembly of cable products or components is completed, quality inspection procedures, such as electrical characteristic test, shall be carried out to determine whether the cable products or components are qualified. As shown in FIG. 1, some cable products or assemblies 10 have a plurality of connectors a, b, c, d and e connected to each other through a plurality of cables 11, and each connector is provided with an electrical component 12. The existing test equipment tests each section of cable and electrical connectors or electrical components one by one. The operation is complex, and it is not suitable for the test of cable products or components with different shapes or specifications.

SUMMARY

According to an embodiment of the present disclosure, an electrical test device for testing electrical characteristics of a cable assembly with a plurality of cable connectors includes a frame having a test platform, and an electrical tester mounted on the frame for testing the electrical characteristics of the cable assembly. A cable connecting and holding mechanism is provided on the test platform and includes a plurality of connector carriers, wherein each connector carrier holds one of the plurality of cable connectors of the cable assembly and electrically connecting the one cable connector to the electrical tester.

BRIEF DESCRIPTION OF THE DRAWINGS

The invention will now be described by way of example with reference to the accompanying Figures, of which.

DETAILED DESCRIPTION OF THE EMBODIMENTS

Figure 1:
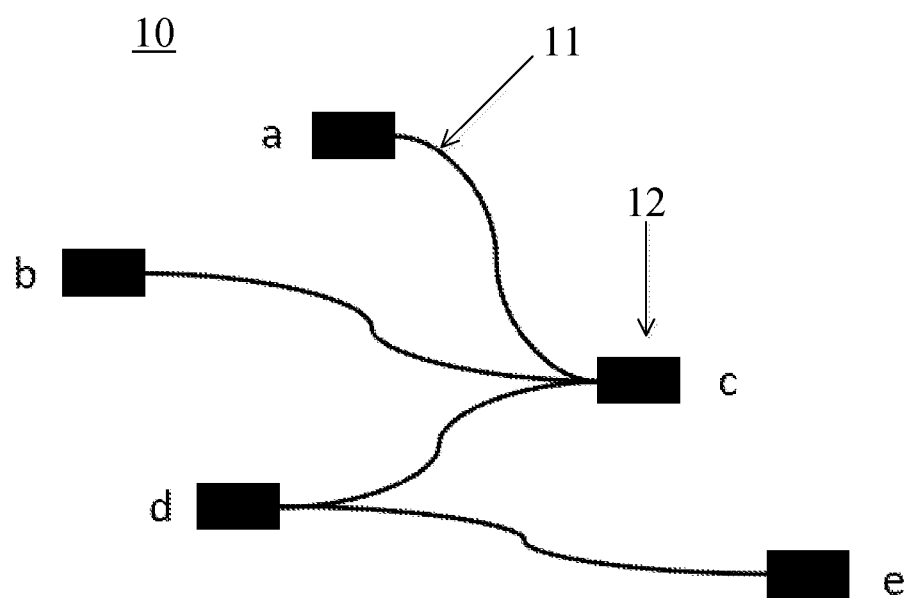
FIG. 1 schematically shows an example of a cable assembly with connectors.

Exemplary embodiments of the present disclosure will be described hereinafter in detail with reference to the attached drawings, wherein the like reference numerals refer to the like elements. The present disclosure may, however, be embodied in many different forms and should not be construed as being limited to the embodiment set forth herein; rather, these embodiments are provided so that the present disclosure will be thorough and complete, and will fully convey the concept of the disclosure to those skilled in the art.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

According to a general concept of the present invention, there is provided an electrical test device for testing electrical characteristics of a cable assembly with a plurality of cable connectors. The electrical test device comprises of: a frame having a test platform; an electrical tester mounted on the frame and configured to test the electrical characteristics of the cable assembly; and a cable connecting and holding mechanism provided on the test platform and including a plurality of connector carriers, each connector carrier is adapted to hold one of the plurality of cable connectors of the cable assembly and electrically connecting the one cable connector to the electrical tester.

According to an exemplary embodiment of the present disclosure, there is provided an electrical test device for testing a variety of characteristics of a cable assembly 10 having a plurality of cable connectors 12, for example the electrical characteristics of the cable connector or the cable, such as an insulation withstand voltage test (HI pot test) for a cable assembly or cable product.

In the illustrated embodiment, as shown in FIGS. 1-6, the electrical test device includes a frame 101 with a test platform 110 and an electrical tester 100. The electrical tester 100 is installed on the frame 101, such as arranged below the test platform 101, for testing the electrical characteristics of the cable assembly 10. As an example, the frame 101 is mobile, for example, equipped with rollers or mounted on a vehicle, so that flexible product testing can be carried out in different sites.

The electrical test device may also include a user interface 300, such as HMI, which can display the test results or test process of the cable assembly by the electrical tester 100, and/or allow the user to make appropriate configuration or setting for the electrical tester 100 through the user interface 300. A control cabinet 400 can also be set or installed on the frame 101, which can be used to control a variety of operations of electrical test device, such as start/stop, power supply, signal processing or transmission, test operation, etc.

According to an exemplary embodiment of the present disclosure, as shown in FIGS. 2-6, the electrical test device also includes a cable connecting and holding mechanism 200, which is arranged or installed on the test platform 110, for example, and includes a plurality of connector carriers 210 spaced from each other. Each connector carrier 210 is adapted to hold one cable connector 12 of cable assembly 10 and electrically connect the one cable connector 12 to the electrical tester.

In an embodiment according to the present disclosure, as shown in FIGS. 2-6, each connector carrier 210 includes a housing 211 and a mating connector 212 provided in the housing 211, which is suitable for electrical connection with a corresponding cable connector 12.

As an example, the housing 211 of each connector carrier 210 may be provided with an accommodation cavity 213 in which the mating connector 212 is installed, and the accommodation cavity 213 is adapted to receive and hold the inserted cable connector 12 to allow the inserted cable connector 212 to be electrically connected with the mating connector 213 installed in the accommodation cavity 213.

Each connector carrier 210 may be provided with a first indicator 214, which may be switched to on-state when the corresponding connector carrier 210 is selected or set to be ready to receive or have received one cable connector 12 of the cable assembly 10. As an example, the first indicator 214 may be arranged on the front of the housing 211, that is, one side of the housing to receive the cable connector. Before the test, the user can select or configure the appropriate connector carrier 210 through the user interface 300 according to the characteristics of the cable assembly to be tested (such as type, size, number of connectors, etc.).

In some examples, when a connector carrier 210 is selected or set by the user to receive a cable connector 12 of the cable assembly 10, the corresponding first indicator 214 may be lighted in a color (such as green) to indicate that a cable connector 12 of the cable assembly 10 can be inserted into the accommodation cavity 213 of the connector carrier 210 and electrically connected with the mating connector 212. When the cable connector 12 has been inserted into the accommodation cavity 213 of the connector carrier 210 and electrically connected with the mating connector 212, the corresponding first indicator 214 can be switched to be lighted in another color (such as red or other appropriate color) to indicate that the connector carrier 210 no longer receives other cable connectors.

In some exemplary embodiments, the mating connector 212 can be replaced to be suitable for electrical connection with different types or sizes of mating connectors, so that the test modes of the electrical test device can be rapidly switched to test different types of cable products or components. As an example, the mating connector 212 may be detachably mounted in the housing 211, that is, removably mounted in the accommodation cavity 213 of the connector carrier 210. Accordingly, the accommodation cavity 213 of each or at least one connector carrier 210 is adapted to accommodate different types or sizes of mating connectors 212 and cable connectors 12.

Figure 2:
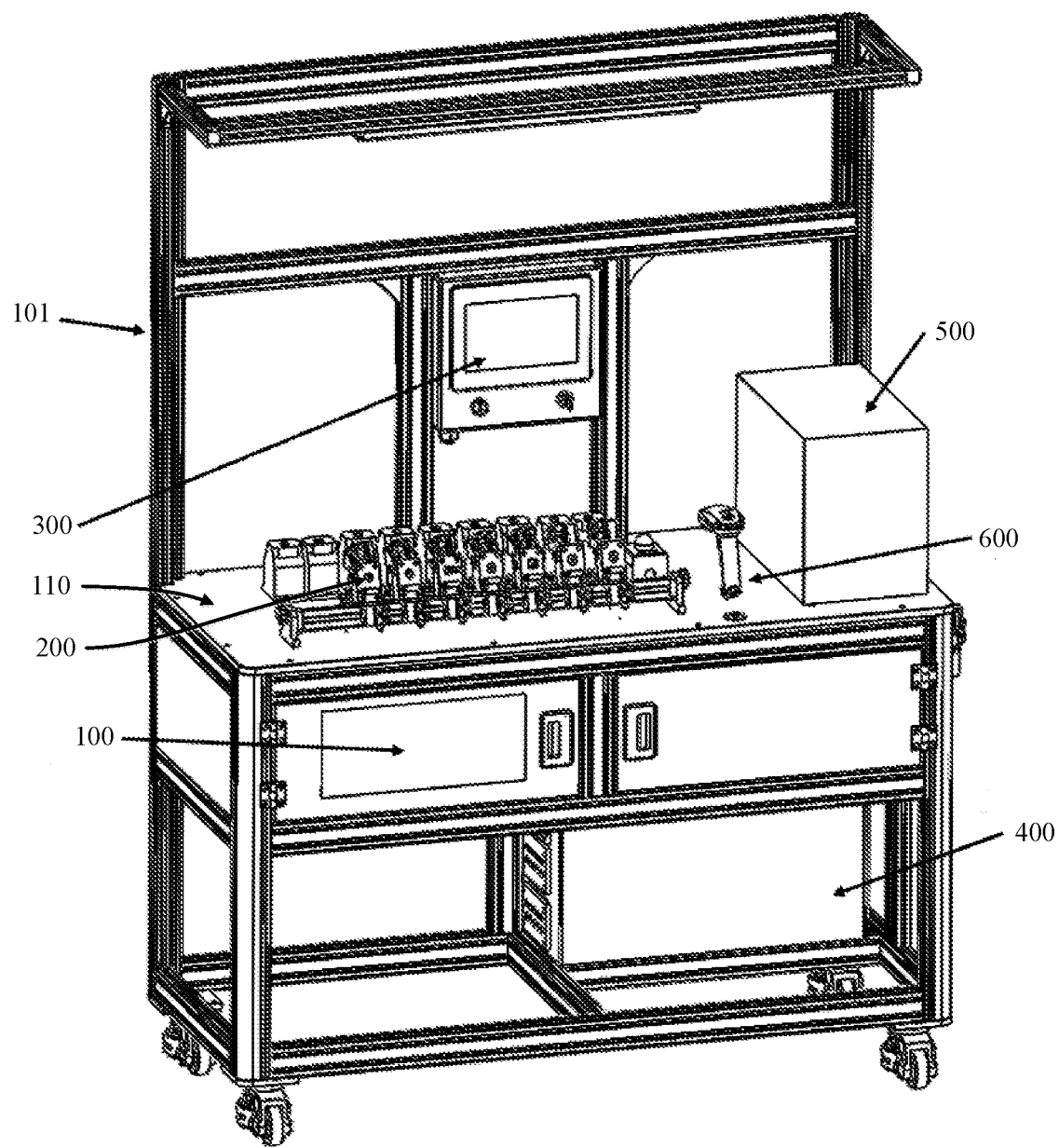
FIG. 2 is a perspective view schematically showing an electrical test device according to an exemplary embodiment of the present disclosure.
Figure 3:
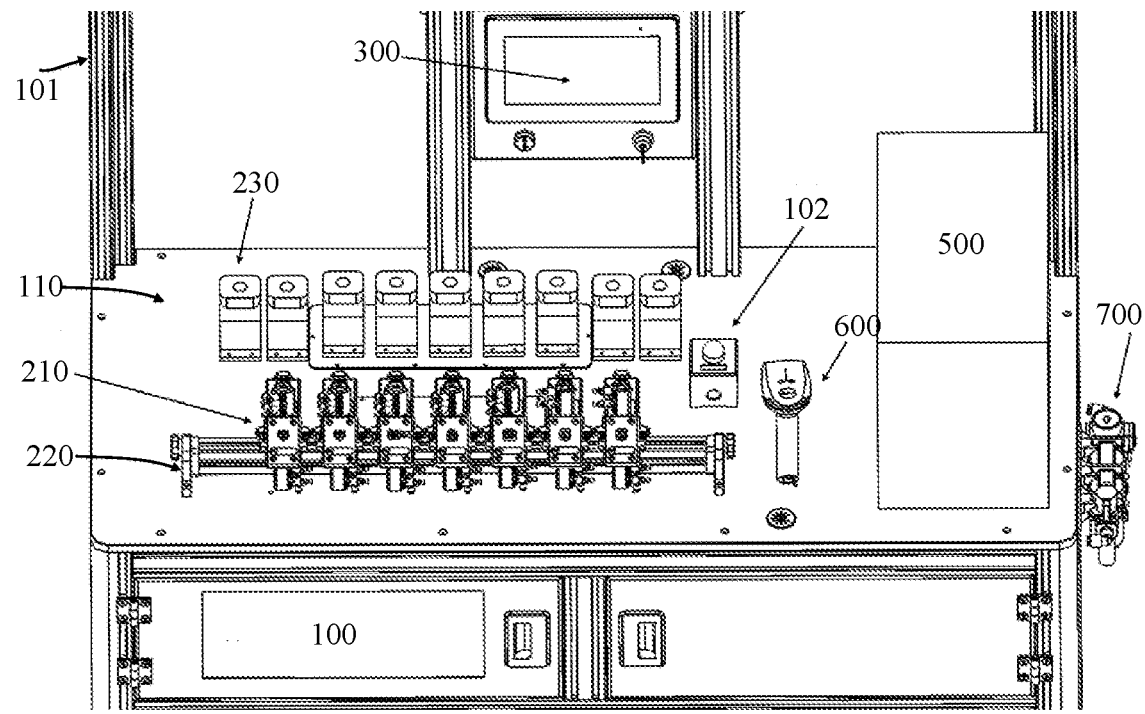
FIG. 3 is a partially enlarged view schematically showing a partial configuration of an electrical test device according to an exemplary embodiment of the present disclosure.
Figure 4:
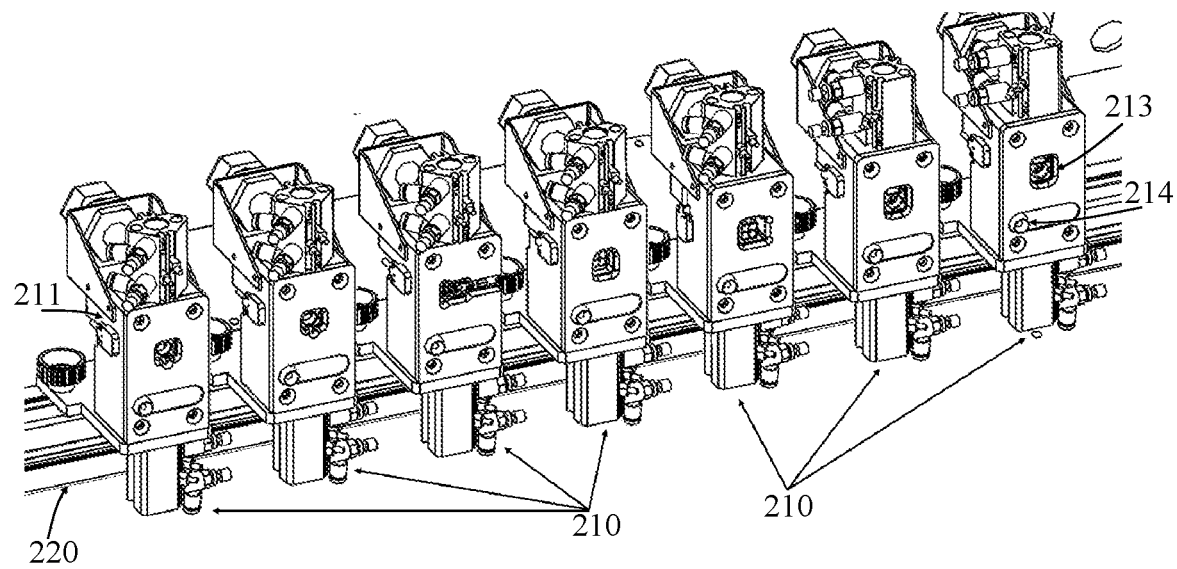
FIG. 4 is a perspective view schematically showing a connecting and holding mechanism of an electrical test device according to an exemplary embodiment of the present disclosure.

In the embodiment shown in FIGS. 2-4, the cable connecting and holding mechanism 200 may also include a guide rail 220 arranged on the test platform. The plurality of connector carriers 210 are detachably installed on the guide rail 220 for replacement or installation, and the connector carrier 210 can move along the guide rail 220 to adjust the spacing between the connector carriers 210 or the distance from the cable assembly to be tested, to better adapt to the testing of cable assemblies or products of different types or sizes.

As shown in FIGS. 2 and 3, the cable connecting and holding mechanism 200 may also include additional connectors 230, such as Harding connectors, or various connecting wires and pipes (pneumatic or hydraulic pipes) connected to the connector 230, and the connector 230 may be mechanically or electrically connected with the electrical tester 110, the control cabinet 400 and the interface 700 to transmit power, signal and force.

Figure 5:
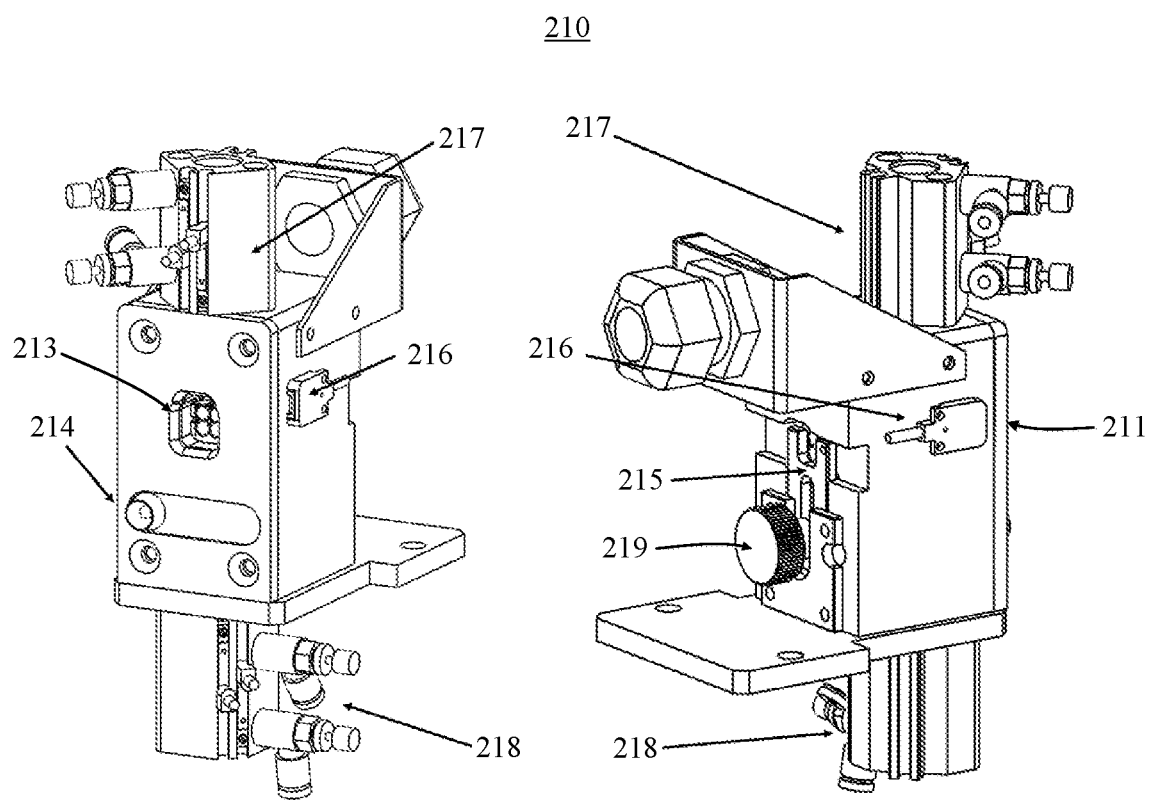
FIG. 5 is a side perspective view schematically showing a connector carrier of an electrical test device according to an exemplary embodiment of the present disclosure.
Figure 6:
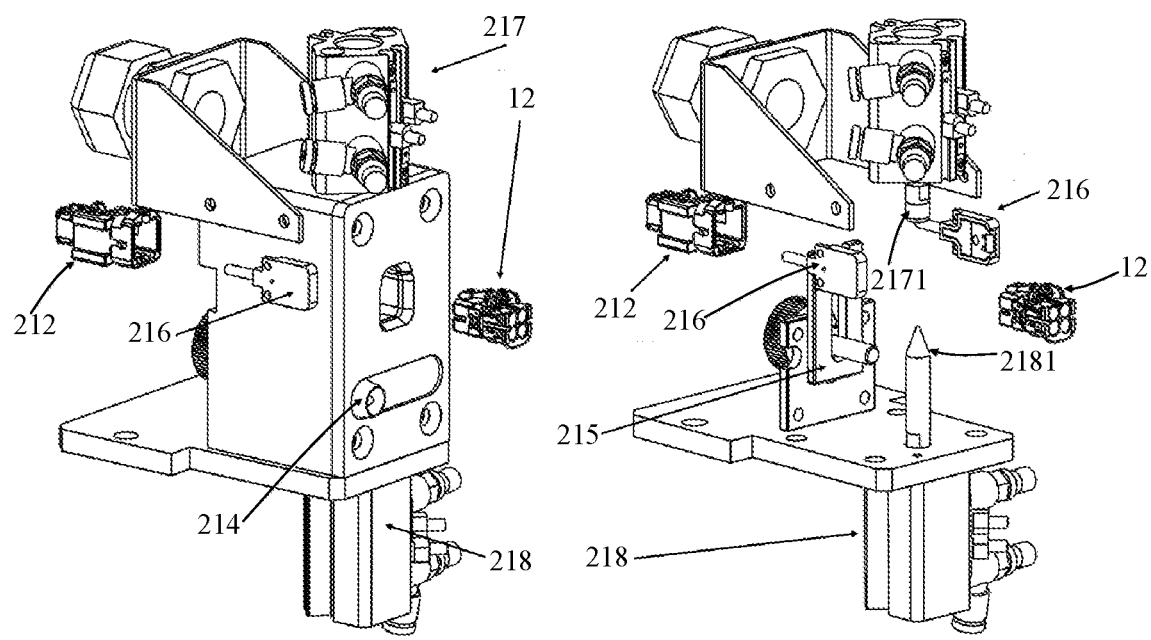
FIG. 6 is a perspective view schematically showing the other side of the connector carrier of the electrical test device according to the exemplary embodiment of the present disclosure, wherein the housing has been removed to show the internal structure of the connector carrier.

As shown in FIGS. 5 and 6, each or at least one connector carrier 210 may also include a partition plate 215 mounted to the housing 211, which is used to prevent the mating connector 212 from being pushed out of the housing 213 due to the force of inserting the cable connector 12, for example, when the cable connector 12 is inserted into the housing 213 to connect with the mating connector 212. The partition plate 215 may be located on the side of the accommodation cavity 213 opposite to the inserted cable connector 12 to abut against the mating connector 212 installed in the accommodation cavity 213.

In addition, as shown in FIGS. 5 and 6, the connector carrier 210 may be provided with a knob locking member 219, which is located on the back of the housing 211, for example, for locking the partition plate 215 to the housing 211. By releasing the knob locking member 219, the partition plate 215 can be removed to allow the mating connector 212 to be removed from the accommodation cavity 213, so that the mating connector can be installed or replaced.

In some exemplary embodiments, as shown in FIGS. 5 and 6, each or at least one connector carrier 210 may also include a connector presence check sensor 216, such as a photoelectric sensor such as an infrared or laser sensor, which is mounted to the housing 211, such as on one or opposite sides of the accommodation cavity 213. The connector presence check sensor 216 is used to check whether the cable connector 12 of the cable assembly 10 has been inserted into the accommodation cavity 213.

The connector presence check sensor 216 may communicate with the first indicator 214 or the user interface 300 to transmit a signal indicating the presence or absence of the cable connector 12 in the accommodation cavity 213 to the first indicator 214 or its controller, the user interface 300, or the controller of the electrical test device. In addition, it is also possible to detect whether the cable connector 12 inserted into the accommodation cavity 213 is electrically connected with the mating connector 212 installed in the accommodation cavity 213 through the connector presence check sensor 216 or other additional sensors.

For example, when the inserted cable connector 12 is not electrically connected or correctly electrically connected with the mating connector 212 installed in the accommodation cavity 213, or when the cable connector 12 is inserted into an inappropriate (such as not selected or configured) connector carrier 210, the first indicator 214 or other alarm corresponding to the connector carrier 210 can give an indication, such as flashing or alarm.

As shown in FIG. 6, the connector carrier 210 may also include a locking mechanism 2171 mounted to the housing 211, such as a rod-shaped member, which can lock the inserted cable connector 12 (such as pressing) when the connector presence check sensor 216 detects that the cable connector 12 has been inserted into the accommodation cavity 213 and/or the cable connector 12 is correctly electrically connected with the mating connector 212 in the accommodation cavity 213. For example, the locking mechanism 2171 may be installed above the accommodation cavity, and the locking mechanism 2171 may be driven up and down by a driving mechanism 217 such as a piston cylinder to lock or release the cable connector 12.

In the embodiment shown in FIG. 6, the connector carrier 210 also includes a calibration mechanism 2181 mounted to the housing 211, which can be used when the cable assembly 10 has been passed the electrical characteristic test performed by the electrical tester 110, that is, when the test performed by the electrical tester 110 shows that the electrical characteristics of the tested cable assembly or its cable connector are qualified or meet the predetermined requirements, the calibration mechanism 2181 will set a mark on cable connector 12 of the cable assembly. For example, the calibration mechanism 2181 may include a thimble, which can be moved to press against the cable connector 12 under the drive of a driving mechanism 218 and leave marks on the cable connector 12, such as indentation or stamp, indicating that the electrical characteristics of the cable assembly or its cable connector are qualified or meet the predetermined requirements. The final test result may be sent to the user by the user interface 300 or a separately set second indicator 102.

For example, as shown in FIGS. 2 and 3, the electrical test device may also include a label printer 500, which may be arranged on the frame 101, such as on the test platform 110 or other suitable position, or outside the frame. When the cable assembly has been passed the electrical characteristic test performed by the electrical tester 110, the label printer 500 prints a label indicating that the test has been passed. The label can be attached to the tested cable assembly or product by the user or machine. In some cases, labels affixed to cable components or products may be scanned by scanner 600 for recording or preservation. After that, the tested cable components or products can be uninstalled to prepare for the next test.

In addition, the electrical test device may also include one or more power interfaces or electrical interfaces 700, and the external equipment may provide electric power, signal, and mechanical power (such as pneumatic or hydraulic power) to the electrical test device via the interface 700.

In addition, those areas in which it is believed that those of ordinary skill in the art are familiar, have not been described herein in order not to unnecessarily obscure the invention described. Accordingly, it has to be understood that the invention is not to be limited by the specific illustrative embodiments, but only by the scope of the appended claims.

It should be appreciated for those skilled in this art that the above embodiments are intended to be illustrated, and not restrictive. For example, many modifications may be made to the above embodiments by those skilled in this art, and various features described in different embodiments may be freely combined with each other without conflicting in configuration or principle.

Although several exemplary embodiments have been shown and described, it would be appreciated by those skilled in the art that various changes or modifications may be made in these embodiments without departing from the principles and spirit of the disclosure, the scope of which is defined in the claims and their equivalents.

As used herein, an element recited in the singular and proceeded with the word "a" or "an" should be understood as not excluding plural of the elements or steps, unless such exclusion is explicitly stated. Furthermore, references to "one embodiment" of the present disclosure are not intended to be interpreted as excluding the existence of additional embodiments that also incorporate the recited features. Moreover, unless explicitly stated to the contrary, embodiments "comprising" or "having" an element or a plurality of elements having a particular property may include additional such elements not having that property.

What is claimed is:

1. An electrical test device comprising:
a frame having a test platform;
an electrical tester mounted on the frame and configured to test the electrical characteristics of a cable assembly; and
a cable connecting and holding mechanism provided on the test platform and including a plurality of connector carriers,
wherein each connector carrier is adapted to hold one of the plurality of cable connectors of the cable assembly and electrically connect the one cable connector to the electrical tester, the cable connecting and holding mechanism further comprises a guide rail provided on the test platform, and the plurality of connector carriers are detachably installed on the guide rail and capable of being moved along the guide rail.

2. The electrical test device according to claim 1, wherein each connector carrier comprises:
a housing; and
a mating connector provided in the housing suitable for electrical connection with a corresponding cable connector.

3. The electrical test device according to claim 2, wherein the housing has an accommodation cavity, the mating connector is installed in the accommodation cavity.

4. The electrical test device according to claim 3, wherein the cable connector is adapted to be inserted into the accommodation cavity, so that the inserted cable connector is electrically connected with the mating connector installed in the accommodation cavity.

5. The electrical test device according to claim 2, wherein each connector carrier is provided with a first indicator, and the first indicator is switched to an on-state in response to selecting or setting the connector carrier to receive one cable connector of the cable assembly.

6. The electrical test device according to claim 3, wherein each connector carrier also includes a partition plate installed in the housing, the partition plate is located at a side of the accommodation cavity opposite to the inserted cable connector to abut against the mating connector installed in accommodation cavity.

7. The electrical test device according to claim 3, wherein each connector carrier further comprises a connector presence check sensor mounted to the housing, and the connector presence check sensor is configured to check whether the cable connector of the cable assembly has been inserted into the accommodation cavity.

8. The electrical test device according to claim 7, wherein each connector carrier further comprises a locking mechanism mounted to the housing, and the locking mechanism is configured to lock the cable connector in the accommodation cavity when the connector presence check sensor detects that the cable connector has been inserted into the accommodation cavity.

9. The electrical test device according to claim 8, wherein each connector carrier also includes a calibration mechanism mounted to the housing, and the calibration mechanism is configured to set a marker on the cable connector after the cable connector has been passed the electrical characteristic test performed by the electrical tester.

10. The electrical test device according to claim 2, wherein the mating connector is detachably installed in the housing.

11. The electrical test device according to claim 3, wherein the mating connector is replaceable, and each accommodation cavity is suitable for receiving different types or sizes of mating connectors and cable connectors.

12. The electrical test device according to claim 1, further comprising a user interface for displaying test results of the cable assembly by the electrical tester.

13. The electrical test device according to claim 12, wherein the user interface is adapted to enable a user to configure the electrical tester.

14. The electrical test device according to claim 1, further comprising a label printer provided on the frame and configured to print a label, which indicates that the test has passed, on the cable assembly after the cable assembly has passed the electrical characteristic test performed by the electrical tester.

15. An electrical test device comprising:
an electrical tester for testing the electrical characteristics of a cable assembly; and
a cable connecting and holding mechanism including a plurality of connector carriers, each connector carrier holding one of a plurality of cable connectors of the cable assembly and electrically connecting the one cable connector to the electrical tester, each connector carrier includes a housing and a mating connector provided in the housing and connectable to a corresponding cable connector.

16. The electrical test device according to claim 15, wherein the housing defines an accommodation cavity, the mating connector being installed in the accommodation cavity.

17. The electrical test device according to claim 16, wherein the cable connector is inserted into the accommodation cavity and electrically connected with the mating connector installed in the accommodation cavity.

18. The electrical test device according to claim 15, wherein each connector carrier is provided with a first indicator, the first indicator is switched to an on-state in response to selecting or setting the connector carrier to receive one cable connector of the cable assembly.

19. An electrical test device comprising:
a frame having a test platform;
an electrical tester mounted on the frame and configured to test the electrical characteristics of a cable assembly;
a cable connecting and holding mechanism provided on the test platform and including a plurality of connector carriers, wherein each connector carrier is adapted to hold one of the plurality of cable connectors of the cable assembly and electrically connect the one cable connector to the electrical tester; and
a user interface for displaying test results of the cable assembly by the electrical tester.

20. The electrical test device according to claim 19, wherein the user interface is adapted to enable a user to configure the electrical tester.

21. An electrical test device comprising:
a frame having a test platform;
an electrical tester mounted on the frame and configured to test the electrical characteristics of a cable assembly;
a cable connecting and holding mechanism provided on the test platform and including a plurality of connector carriers, wherein each connector carrier is adapted to hold one of the plurality of cable connectors of the cable assembly and electrically connect the one cable connector to the electrical tester; and
a label printer provided on the frame and configured to print a label, which indicates that the test has passed, on the cable assembly after the cable assembly has passed the electrical characteristic test performed by the electrical tester.

22. An electrical test device comprising:
an electrical tester for testing the electrical characteristics of a cable assembly; and
a cable connecting and holding mechanism including a plurality of connector carriers, each connector carrier holding one of a plurality of cable connectors of the cable assembly and electrically connecting the one cable connector to the electrical tester, each connector carrier is provided with a first indicator, the first indicator is switched to an on-state in response to selecting or setting the connector carrier to receive one cable connector of the cable assembly.

* * * * *